(12) United States Patent
Furukawa et al.

(10) Patent No.: US 7,393,779 B2
(45) Date of Patent: Jul. 1, 2008

(54) SHRINKING CONTACT APERTURES THROUGH LPD OXIDE

(75) Inventors: Toshiharu Furukawa, Essex Junction, VT (US); Mark C. Hakey, Fairfax, VT (US); Steven J. Holmes, Guilderland, NY (US); David V. Horak, Essex Junction, VT (US); Charles W. Koburger, III, Delmar, NY (US); Larry A. Nesbit, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 459 days.

(21) Appl. No.: 11/163,786

(22) Filed: Oct. 31, 2005

(65) Prior Publication Data

US 2007/0099416 A1    May 3, 2007

(51) Int. Cl.
*H01L 21/4763* (2006.01)
(52) U.S. Cl. ............... 438/637; 438/639; 438/622; 257/E21.577
(58) Field of Classification Search ............... 438/622, 438/624, 637, 639
See application file for complete search history.

(56) References Cited

U.S. PATENT DOCUMENTS

| | | | |
|---|---|---|---|
| 4,468,420 A | 8/1984 | Kawahara et al. | |
| 4,693,916 A | 9/1987 | Nagayama et al. | |
| 4,770,901 A | 9/1988 | Katoh et al. | |
| 4,882,183 A | 11/1989 | Ino et al. | |
| 5,073,408 A | 12/1991 | Goda et al. | |
| 5,114,760 A | 5/1992 | Takemura et al. | |
| 5,132,140 A | 7/1992 | Goda et al. | |
| 5,614,270 A | 3/1997 | Yeh et al. | |
| 5,648,128 A | 7/1997 | Yeh et al. | |
| 5,661,051 A | 8/1997 | Yeh et al. | |
| 5,756,397 A * | 5/1998 | Jun | 438/624 |
| 5,776,829 A | 7/1998 | Homma et al. | |
| 6,251,753 B1 | 6/2001 | Yeh et al. | |
| 6,294,832 B1 | 9/2001 | Yeh et al. | |
| 6,410,423 B1 * | 6/2002 | Anezaki et al. | 438/637 |
| 6,653,245 B2 | 11/2003 | Liang et al. | |
| 2004/0043149 A1 | 3/2004 | Gordon et al. | |

OTHER PUBLICATIONS

T. Homma eh al., "A selective SiO2 Film-Formation Technology Using Liquid-Phase Deposition for Fully Planarized Multilevel Interconnections", J. Electrochem Soc. vol. 140, No. 8, Aug. 1993, pp. 2410-2414.

(Continued)

*Primary Examiner*—Thanh Nguyen
(74) *Attorney, Agent, or Firm*—Ira D. Blecker; Wenjie Li

(57) ABSTRACT

Sublithographic contact apertures through a dielectric are formed in a stack of dielectric, hardmask and oxide-containing seed layer. An initial aperture through the seed layer receives a deposition of oxide by liquid phase deposition, which adheres selectively to the exposed vertical walls of the aperture in the seed layer. The sublithographic aperture, reduced in size by the thickness of the added material, defines a reduced aperture in the hardmask. The reduced hardmask then defines the sublithographic aperture through the dielectric.

20 Claims, 2 Drawing Sheets

OTHER PUBLICATIONS

C. Yeh, et al., "Comprehensive Investigation on Fluorosilicate Glass Prepared by Temperature-Difference Based Liquid-Phase Deposition", Journal of the Electrochemical Society, vol. 147, pp. 330-334, 2000.

C. Yeh et al., "Novel Barrier Dielectric Liner Prepared by Liquid-Phase Deposition and NH3-Plasma Annealing", J. Appl. Physics, vol. 29 (2000) pp. 6672-6675, Part 1 No. 12A, Dec. 2000.

T. Homma, et al., "Optical Properties of Fluorinated Silicon Oxide and Organic Spin-on-Glass Films for Thin-Film Optical Waveguides", Journal of the Electrochemical Society, vol. 147, (3) pp. 1141-1144 (2000).

H. Nagayama, etal., "A New Process for Silica Coating", J. Electrochem. Soc. Solid-State Science and Technology, Aug. 1988, pp. 2013-2016.

* cited by examiner

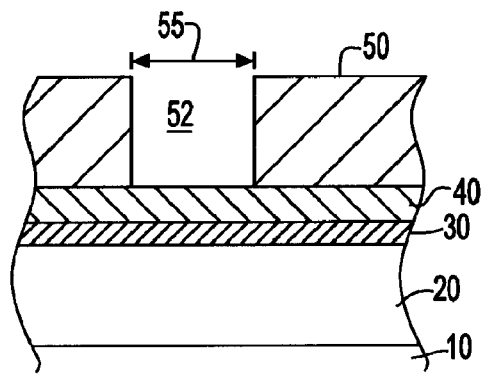
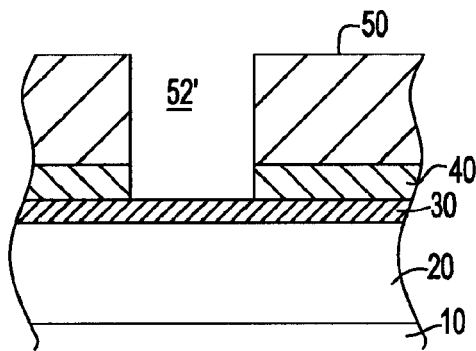
FIG. 1                    FIG. 2
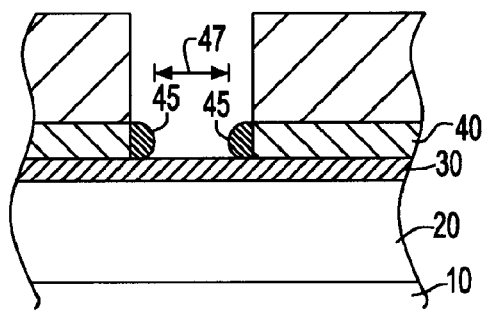
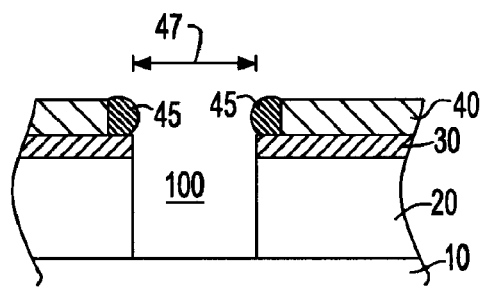
FIG. 3                    FIG. 4

1

SHRINKING CONTACT APERTURES THROUGH LPD OXIDE

TECHNICAL FIELD

The field of the invention is that of fabricating integrated circuits, in particular forming apertures of sub-lithographic dimensions through a dielectric.

BACKGROUND OF THE INVENTION

As dimensions have shrunk, lithographic engineers have resorted to various methods to reduce the size of apertures passing through interlevel dielectrics such as growing a polymer on the vertical surface of a resist hole (Relacs); a reflow of resist; a negative etch bias in transferring the contact hole to the substrate; and deposition of a sidewall spacer on the inside of the contact hole.

The negative etch bias often introduced a slope in the profile of the aperture, resulting in poor control of the aperture size.

The spacer approach introduced an additional etch step.

Various approaches have been shown in patents for depositing layers of oxide from the liquid phase, such as U.S. Pat. No. 6,251,753, U.S. Pat. No. 6,653,245, and U.S. Pat. No. 5,776,829 incorporated by reference.

SUMMARY OF THE INVENTION

The invention relates to a method of reducing the size of a contact aperture being etched into a dielectric.

A feature of the invention is the etching of an oversized hole using current lithography through a hardmask containing oxide bonds.

Another feature of the invention is the selective liquid phase deposition (LPD) of oxide on an exposed interior aperture surface containing Si—OH bonds.

Yet another feature of the invention is etching an aperture through the underlying dielectric using the reduced diameter hole as a mask.

BRIEF DESCRIPTION OF THE DRAWINGS

FIG. 1 shows a stack of films for use with the invention.

FIG. 2 shows the result of etching an oversized hole through a sacrificial oxide.

FIG. 3 shows the result of selective growing oxide on the exposed oxide surface.

FIG. 4 shows the result of using the reduced-size hole as an etch mask.

DETAILED DESCRIPTION

Figure 5:
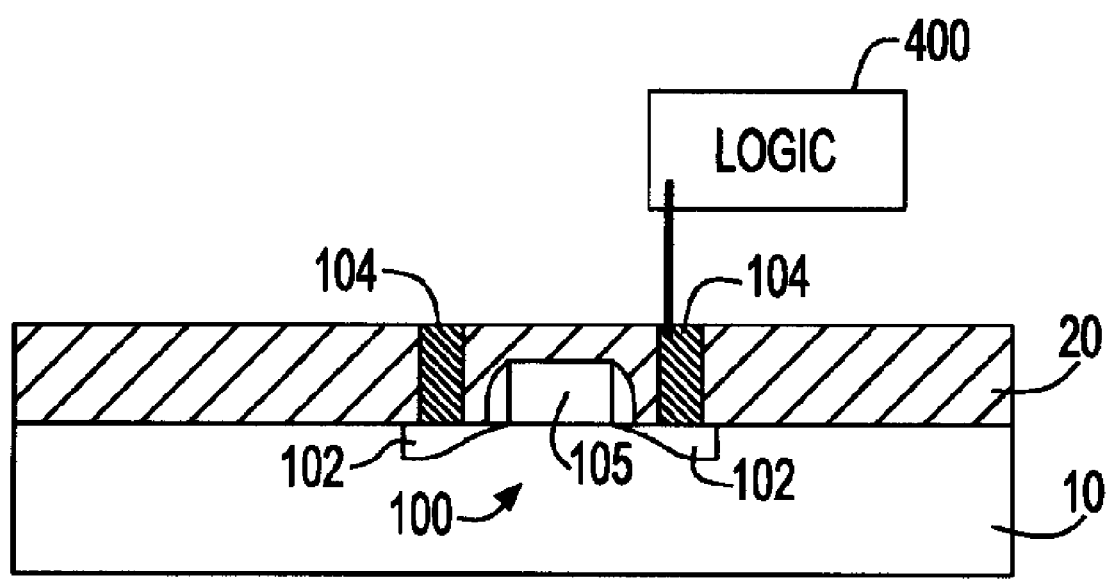
FIG. 5 shows a partially pictorial, partially schematic view of an integrated circuit using the invention.

FIG. 1 illustrates a portion of an integrated circuit being fabricated showing a substrate 10 that will contain underlying layers, e.g. source/drain areas of planar transistors, other lower interconnect structures, the bulk silicon, etc, not shown in this figure.

Dielectric 20 is illustratively an interlayer dielectric such as silicon dioxide, a fluorinated silicon dioxide, a silicon oxycarbide material (such as black diamond™ from Applied Materials), an organic material such as SiLK™ or polyimide. The thickness of this material is typically in the range of 500-1000 nm, with preferred values of 600-800 nm. This material will be referred to as the pattern layer, since the result of the process is the formation of a pattern of apertures in this layer.

A hard mask 30 such as nitride ($Si_3N_4$) or polysilicon will be patterned with a hole that is larger than the desired final size and, after processing according to the invention, serve as the mask to etch an aperture through dielectric 20. Preferably, the initial hole will be formed by conventional lithographic techniques. If the desired final size is so much smaller than the smallest conventional aperture, the initial hole may be formed by a sublithographic technique such as sidewall image transfer.

A layer 40 containing Si—OH bonds (or having a fraction of oxide, $SiO_2$) has been deposited over the hardmask layer 30. This layer 40 will serve as a seed layer for the selective deposition of silicon oxide from an aqueous solution. This oxide-containing material can be a conventional layer of CVD oxide such as TEOS, or a spin-on glass material, or a silsesquioxane material.

Layer 40 could also be a siloxane resist material that is photo sensitive and may be directly imaged with a contact hole pattern.

Layer 40 could also be an anti-reflective layer ordinarily used for a photoresist layer, e.g. HOSP, available from Honeywell.

The seed layer 40 can range in thickness from 20-200 nm, with a range of 20-50 nm preferred for an oxide or antireflective layer and 100-200 preferred for a resist layer.

Typically, resist layer 50 is spun-on over seed layer 40, exposed and developed to form the structure in FIG. 1, having aperture 52 with dimension 55. Dimension 55 may be sub-lithographic using a standard technique or it may be formed by a conventional lithographic process.

A directional oxide etch (illustratively with $CHF_3/O_2$ mixtures at 10-100 mtorr, with the wafer biased to create an ion-driven etch process at the wafer surface), stopping on nitride 30, is used to remove the oxide-containing seed layer 40 at the bottom of the aperture 52 to produce the result shown in FIG. 2.

With the vertical sides of the oxide-containing seed layer 40 exposed (and the top surface covered by the resist) the wafer is immersed in a saturated hydrofluoro-silicic acid $H_2SiF_6$ solution, as described in the US patents listed in the background section of the specification, and a film of oxide is grown on the exposed vertical surface through LPD.

The thickness of the LPD-grown film can range from 5-50 nm or so, for high-density CMOS applications, in which case the width 55 of the contact hole pattern in aperture 52' is reduced by a corresponding 10-100 nm.

The amount of oxide that is permitted to grow will depend on the desired width reduction and may preferentially be 20-30 nm for many applications.

FIG. 3 shows the result of the LPD step, in which an oxide film 45 has been formed on the vertical surfaces of seed layer 40. The diameter of the aperture has been reduced to a value 47, equivalent to the value 55 minus twice the thickness of film 45.

Several options are available to achieve a selective oxide deposition process. If a high quality silicon nitride layer is used as the hardmask 30, then it will not react with the hydrosilicic acid, in the case of LDP, or with Trimethyl aluminum, in the case of the ALD growth of silicon oxide. Alternatively, if layer 30 is composed of polysilicon, it can be passivated with fluorine by exposing it to HF vapor prior to LDP or ALD oxide growth. In another option, one can use a siloxane resist over nitride layer 30, or over polysilicon layer 30, or over an unreactive organic underlayer such as diamondlike carbon annealed in hydrogen, parylene, or bottom antireflective coating. These undercoat films may also be treated with hexamethyidisilazane prior to resist apply, as a means of masking any reactive chemical species on their surface. The siloxane resist is exposed and developed down to the unreactive organic underlayer, followed by growth of the LPD or ALD oxide film directly onto the siloxane resist.

In an alternative to the growth of the oxide film by LPD, one might also use an atomic layer deposition process, such as that disclosed in US 2004/0043149 (incorporated by reference). In this process, a vapor of trimethylaluminum reacts with active hydroxyl groups on the surface of silicon oxide or siloxane films to create a surface-bound aluminum catalyst species. Then, a vapor of tris(t-butoxy)silanol is introduced to the substrate to grow films of 5-12 nm, depending on reaction time and temperature, at 200-300 C. The catalyst treatment can be repeated, followed by exposure to fresh silanol reagent, to grow films of the desired thickness. This process is highly uniform and conformal, due to its nature as a surface-limited reaction.

FIG. 4 shows the result of stripping resist 50 and etching through hardmask 30 and then through ILD 20. The LPD film 45 serves to define the dimension of the aperture formed in hardmask 30. After the aperture in hardmask 30 is formed, the hardmask defines the width of aperture 100. It does not matter, therefore, if the etch process used for ILD 20 attacks the film 45.

FIG. 5 illustrates in a partially pictorial, partially schematic view of an integrated circuit, in which substrate 10 represents a bulk or SOI substrate, and a transistor 100 having source/drain 102 has been formed by conventional deposition, lithography and implantation techniques. A first level dielectric 20 has apertures formed according to the invention filled with a conductor 104 to form vias, one of which connects to block 400 that represents schematically the remainder of the integrated circuit. The preliminary steps of blanket implants, forming the various transistors will be referred to for purposes of the claims as preparing the substrate and the later steps after the sublithographic vias have been formed; i.e. forming the interconnects and the remainder of the back end processing will be referred to as completing the circuit.

The etching techniques and etch chemistry will depend on the material being etched and the underlying layer below that material. In an illustrative example, the material of layer 40 is oxide, the material of layer 30 is nitride, and the material of layer 20 is oxide. The etch process to form aperture 52' is a conventional oxide etch that stops on nitride 30. The etch process to form aperture 100 is also a conventional oxide etch that is resisted by hardmask 30.

Advantageously, the thickness of layers 40 and 50 are set such that resist layer 50 and seed layer 40 are both consumed during the etch process that opens aperture 100, so that a removal step for these layers is not required. If that is not practical in a particular example, then any remainder of layer 40 will be stripped.

In a particular example in which layer 40 is a siloxane photoresist, layer 50 will not be used and aperture 52' will be formed directly in layer 40.

While the invention has been described in terms of a single preferred embodiment, those skilled in the art will recognize that the invention can be practiced in various versions within the spirit and scope of the following claims.

What is claimed is:

1. A method of forming an aperture in a pattern layer, comprising the steps of:
   depositing said pattern layer on a substrate;
   depositing a hardmask on said pattern layer;
   depositing a seed layer on said hardmask layer;
   forming at least one aperture, having reference dimensions, in said seed layer, extending through said seed layer and exposing vertical sides of said seed layer in said aperture;
   selectively growing a reduction thickness of oxide by one of LPD and ALD on said vertical sides of said seed layer in said aperture, whereby said aperture has reduced dimensions less than said reference dimensions by said reduction thickness;
   forming a reduced aperture in said hardmask, using said seed layer as a mask, thereby forming a reduced aperture in said hardmask having substantially said reduced dimensions; and
   etching at least one aperture in said pattern layer using said reduced aperture in said hardmask.

2. A method according to claim 1, in which said seed layer is a photosensitive siloxane resist.

3. A method according to claim 1, in which said seed layer is an anti-reflective coating; and
   further comprising steps of applying a layer of photoresist to said seed layer and applying, exposing and developing said photoresist with a pattern of at least one aperture.

4. A method according to claim 1, in which said seed layer is selected from the group consisting of silicon oxide, spin-on-glass and silsesquioxane; and
   further comprising steps of applying a layer of photoresist to said seed layer and applying, exposing and developing said photoresist with a pattern of at least one aperture.

5. A method according to claim 1, in which said seed layer is consumed during said step of etching at least one aperture in said pattern layer using said reduced aperture in said hardmask.

6. A method according to claim 2, in which said seed layer is consumed during said step of etching at least one aperture in said pattern layer using said reduced aperture in said hardmask.

7. A method according to claim 3, in which said seed layer and said photoresist layer are consumed during said step of etching at least one aperture in said pattern layer using said reduced aperture in said hardmask.

8. A method according to claim 4, in which said seed layer and said photoresist layer are consumed during said step of etching at least one aperture in said pattern layer using said reduced aperture in said hardmask.

9. A method of forming an integrated circuit, comprising the steps of:
   preparing a semiconductor substrate;
   a) forming a set of transistors to implement said circuit;
   b) depositing a pattern layer on said substrate;
   c) depositing a hardmask on said pattern layer;
   d) depositing a seed layer on said hardmask layer;
   forming at least one aperture, having reference dimensions, in said seed layer, extending through said seed layer and exposing vertical sides of said seed layer in said aperture;
   e) selectively growing a reduction thickness of oxide by one of LPD and ALD on said vertical sides of said seed layer in said aperture, whereby said aperture has reduced dimensions less than said reference dimensions by said reduction thickness;
   f) forming a reduced aperture in said hardmask, using said seed layer as a mask, thereby forming a reduced aperture in said hardmask having substantially said reduced dimensions;
   g) etching at least one aperture in said pattern layer using said reduced aperture in said hardmask;

h) forming a first level of interconnect including forming conductive vias through said at least one aperture; and i) completing said integrated circuit.

10. A method according to claim 9, in which said seed layer is a photosensitive siloxane resist.

11. A method according to claim 9, in which said seed layer is an anti-reflective coating; and further comprising steps of applying a layer of photoresist to said seed layer and applying, exposing and developing said photoresist with a pattern of at least one aperture.

12. A method according to claim 9, in which said seed layer is selected from the group consisting of silicon oxide, spin-on-glass and silsesquioxane; and further comprising steps of applying a layer of photoresist to said seed layer and applying, exposing and developing said photoresist with a pattern of at least one aperture.

13. A method according to claim 9, in which said seed layer is consumed during said step of etching at least one aperture in said pattern layer using said reduced aperture in said hardmask.

14. A method according to claim 10, in which said seed layer is consumed during said step of etching at least one aperture in said pattern layer using said reduced aperture in said hardmask.

15. A method according to claim 11, in which said seed layer and said photoresist layer are consumed during said step of etching at least one aperture in said pattern layer using said reduced aperture in said hardmask.

16. A method according to claim 12, in which said seed layer and said photoresist layer are consumed during said step of etching at least one aperture in said pattern layer using said reduced aperture in said hardmask.

17. A method according to claim 9, further comprising:
repeating steps b) through h) to form at least one additional layer of interconnect connecting with said first layer of interconnect.

18. A method according to claim 10, further comprising:
repeating steps b) through h) to form at least one additional layer of interconnect connecting with said first layer of interconnect.

19. A method according to claim 11, further comprising:
repeating steps b) through h) to form at least one additional layer of interconnect connecting with said first layer of interconnect.

20. A method according to claim 12, further comprising:
repeating steps b) through h) to form at least one additional layer of interconnect connecting with said first layer of interconnect.

* * * * *